United States Patent
Kim et al.

(10) Patent No.: US 11,823,869 B2
(45) Date of Patent: Nov. 21, 2023

(54) IMPEDANCE MATCHING IN A RF POWER GENERATION SYSTEM

(71) Applicant: MKS Instruments, Inc., Andover, MA (US)

(72) Inventors: Kwang Ho Kim, Yuseong-gu (KR); Jaechul Jung, Sejong (KR); Changhee Lee, Daejeon (KR); Hohyoung Lee, Yuseong-gu (KR); Jongmin Kim, Sejong-si (KR)

(73) Assignee: MKS Instruments, Inc., Andover, MA (US)

( * ) Notice: Subject to any disclaimer, the term of this patent is extended or adjusted under 35 U.S.C. 154(b) by 166 days.

(21) Appl. No.: 17/502,666

(22) Filed: Oct. 15, 2021

(65) Prior Publication Data
US 2023/0123689 A1    Apr. 20, 2023

(51) Int. Cl.
*H03H 7/38* (2006.01)
*H01J 37/32* (2006.01)

(52) U.S. Cl.
CPC .. *H01J 37/32183* (2013.01); *H01J 37/32146* (2013.01); *H03H 7/38* (2013.01)

(58) Field of Classification Search
CPC . H01J 37/32183; H01J 37/32146; H03H 7/38
See application file for complete search history.

(56) References Cited

U.S. PATENT DOCUMENTS

| | | | |
|---|---|---|---|
| 7,602,127 B2 | 10/2009 | Coumou | |
| 8,110,991 B2 | 2/2012 | Coumou | |
| 8,395,322 B2 | 3/2013 | Coumou | |
| 9,711,332 B2 | 7/2017 | Howald et al. | |
| 10,049,857 B2 | 8/2018 | Fisk, II et al. | |
| 10,546,724 B2 | 1/2020 | Radomski et al. | |
| 10,821,542 B2 | 11/2020 | Nelson et al. | |

(Continued)

FOREIGN PATENT DOCUMENTS

| EP | 3694104 A1 | 8/2020 |
|---|---|---|
| JP | 2008147673 A | 6/2008 |

(Continued)

OTHER PUBLICATIONS

International Search Report and Written Opinion regarding International Patent Application No. PCT/US2022/035246, dated Oct. 13, 2022.

*Primary Examiner* — Henry Luong
(74) *Attorney, Agent, or Firm* — Harness, Dickey & Pierce, P.L.C.

(57) ABSTRACT

An impedance matching network including a mixing module. The mixing module receives a plurality admittances based upon at least one parameter sensed from an output which generated by an RF generator. The output signal is a pulsed RF signal having a plurality of states for each pulse and the plurality of admittances correspond to the plurality states. The mixing module generates a virtual admittance determined in accordance with the plurality of admittances adjusted by a gain. The impedance matching module receives the virtual admittance and generates a command to adjust a capacitance of the impedance matching network or a command to adjust a frequency of the output signal in accordance with the virtual admittance.

24 Claims, 12 Drawing Sheets

(56) References Cited

U.S. PATENT DOCUMENTS

| | | | |
|---|---|---|---|
| 2010/0231296 A1* | 9/2010 | Nagarkatti | H03F 1/56 330/192 |
| 2015/0200079 A1 | 7/2015 | Bhutta | |
| 2017/0372872 A1 | 12/2017 | Marakhtanov et al. | |

FOREIGN PATENT DOCUMENTS

| | | |
|---|---|---|
| KR | 10-2010-0125376 A | 11/2010 |
| KR | 10-2020-0097161 A | 8/2020 |

* cited by examiner

IMPEDANCE MATCHING IN A RF POWER GENERATION SYSTEM

FIELD

The present disclosure relates to impedance modules and to control of impedance modules.

BACKGROUND

Plasma fabrication is frequently used in semiconductor fabrication. In plasma fabrication, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a controller for an impedance matching network for a RF power delivery system. The controller includes a mixing module configured to receive a plurality of admittances generated in accordance with at least one parameter sensed from an output signal generated by a RF generator of the RF power delivery system, where the output signal is a pulsed RF signal having plurality of states for each pulse and the plurality of admittances correspond to the plurality of states. The controller is further configured to generate a virtual admittance determined in accordance with the plurality of admittances adjusted by a gain, respectively. The controller also includes an impedance matching module configured to receive the virtual admittance and generate a command to adjust a capacitance of the impedance matching network or a command to adjust a frequency of the output signal in accordance with the virtual admittance. Other embodiments of this aspect include corresponding computer systems, apparatus, and computer programs recorded on one or more computer storage devices, each configured to perform the actions of the methods.

Implementations may include one or more of the following features. The controller where the gain is determined in accordance with the at least one parameter sensed for each respective state of the plurality of states, and where the gain is weighted in accordance with a relative value of the at least one parameter sensed for each respective state of the plurality of states. If there are two of the plurality of states, the gain for each of the two of the plurality of states adds to one. The gain for each of the plurality of states adds to one. The at least one parameter can be voltage, current, forward power, or reverse power. Adjustment of the motor adjusts a variable capacitor of the impedance matching network. The motor control module is further configured to generate a plurality of motor control commands to control a plurality of motors, where adjustment of the plurality of motors adjusts a plurality of variable capacitors of the impedance matching network. One of the plurality of motors adjusts a variable capacitor of a series leg of the impedance matching network and a second of the plurality of motors adjust a variable capacitor of a shunt leg of the impedance matching network. Implementations of the described techniques may include hardware, a method or process, or computer software on a computer-accessible medium.

One general aspect includes an RF power delivery system having a RF power source configured to generate a pulsed RF output signal to a load. The system also includes an impedance matching network arranged between the RF power source and the load, the impedance matching network configured to receive the pulsed RF output signal and provide impedance matching between the RF power source and the load. The matching network includes: a series leg having a first variable impedance; a shunt leg having a second variable impedance; and a controller, including: a mixing module configured to receive a plurality of admittances generated in accordance with at least one parameter sensed from the RF output signal, where a pulse of the output signal has a plurality of states and the plurality of admittances correspond to the plurality of states, and further configured to generate a virtual admittance determined in accordance with the plurality of admittances adjusted by a gain, respectively; and an impedance matching module configured to receive the virtual admittance and generate a command to adjust a capacitance of the impedance matching network or a command to adjust a frequency of the RF signal in accordance with the virtual admittance. Other embodiments of this aspect include corresponding computer systems, apparatus, and computer programs recorded on one or more computer storage devices, each configured to perform the actions of the methods.

Implementations may include one or more of the following features. The RF power delivery system where the impedance matching network further may include a sensor configured to receive the pulse RF output signal and sense the at least one parameter and output the plurality of admittances, where the plurality of admittances vary in accordance with the at least one parameter. The gain is determined in accordance with the at least one parameter sensed for each respective state of the plurality of states, and where the gain is weighted in accordance with a relative value of the at least one parameter sensed for each respective state of the plurality of states. If there are two of the plurality of states, the gain for each of the two of the plurality of states adds to one. The gain for each of the plurality of states adds to one. The at least one parameter can be voltage, current, forward power, or reverse power. Adjustment of the first variable impedance or the second variable impedance occurs by adjusting a first variable capacitor associated with the first variable impedance or a second variable capacitor associated with the second variable impedance. The control commands are motor control commands to a first motor controlling the variable capacitor associated with the first variable impedance and a second motor controlling the variable capacitor associated with the second variable impedance. Implementations of the described techniques may include hardware, a method or process, or computer software on a computer-accessible medium.

One general aspect includes a non-transitory computer-readable medium storing instructions. The non-transitory computer-readable medium storing instructions also includes receiving a plurality of admittances generated in accordance with at least one parameter sensed from an output signal generated by a RF generator of the RF power delivery system, where the output signal is a pulsed RF signal having plurality of states for each pulse and the plurality of admittances correspond to the plurality of states, and generating a virtual admittance determined in accordance with the plurality of admittances adjusted by a gain, respectively. The instructions also include in accordance with virtual admittance, generating a command to adjust a capacitance of the impedance matching network or a command to adjust a frequency of the output signal. Other embodiments of this aspect include corresponding computer systems, apparatus, and computer programs recorded on one or more computer storage devices, each configured to perform the actions of the methods.

Implementations may include one or more of the following features. The non-transitory computer-readable medium storing instructions where the gain is determined in accordance with the at least one parameter sensed for each respective state of the plurality of states, and where the gain is weighted in accordance with a relative value of the at least one parameter sensed for each respective state of the plurality of states. If there are two of the plurality of states, the gain for each of the two of the plurality of states adds to one. The gain for each of the plurality of states adds to one. The at least one parameter can be voltage, current, forward power, or reverse power. Adjustment of the motor adjusts a variable capacitor of the impedance matching network. The motor control module is further configured to generate a plurality of motor control commands to control a plurality of motors, where adjustment of the plurality of motors adjusts a plurality of variable capacitors of the impedance matching network. One of the plurality of motors adjusts a variable capacitor of a series leg of the impedance matching network and a second of the plurality of motors adjust a variable capacitor of a shunt leg of the impedance matching network. Implementations of the described techniques may include hardware, a method or process, or computer software on a computer-accessible medium.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
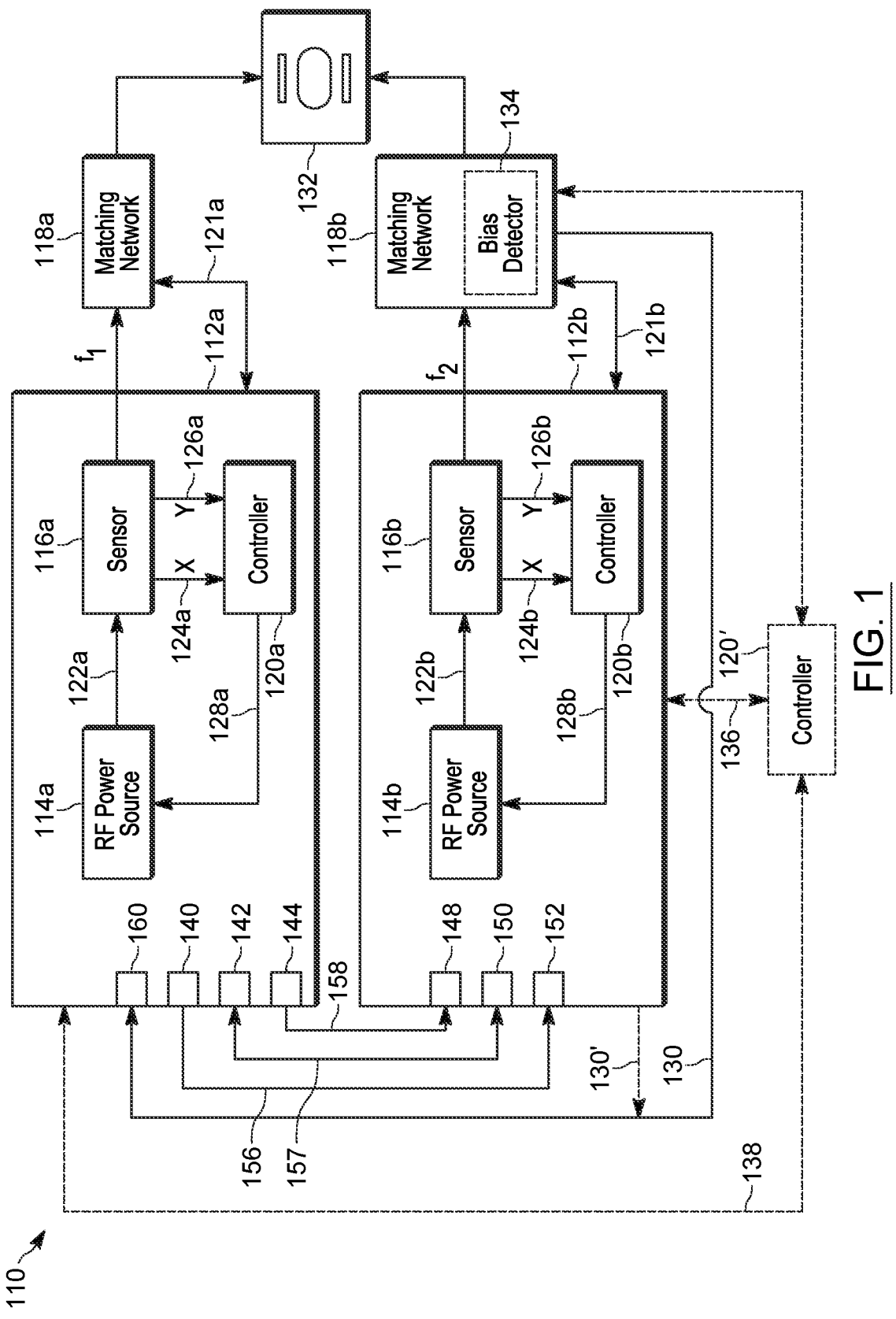
FIG. 1 shows a power delivery system having multiple power supplies arranged according to various embodiments of the present disclosure.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. The impedance matching aids in maximizing an amount of power forwarded to the matching network ("forward power") and minimizing an amount of power reflected back from the matching network to the power generator ("reverse power" or "reflected power"). Forward power may be maximized and reverse power may be minimized when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined by using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The ion energy distribution function (IEDF) can be controlled with the bias power. One way of controlling the IEDF for a system in which multiple RF power signals are applied to the load occurs by varying multiple RF signals that are related by amplitude, frequency and phase. The relative amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents requires a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide-process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. Pat. No. 10,821,542, issued Nov. 3, 2020 and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

FIG. 1 depicts a RF generator or power supply system 110. Power supply system 110 includes a pair of radio frequency (RF) generators or power supplies 112a, 112b, matching networks 118a, 118b, and load 132, such as a non-linear load, which may be a plasma chamber, process chamber, and the like. In various embodiments, RF generator 112a is referred to as a source RF generator or power supply, and matching network 118a is referred to as a source matching network. Also in various embodiments, RF generator 112b is referred to as a bias RF generator or power supply, and matching network 118b is referred to as a bias matching network. It will be understood that the components can be referenced individually or collectively using the reference number without a letter subscript or a prime symbol.

In various embodiments, source RF generator 112a receives a control signal 130 from matching network 118b, or a control signal 130' from bias RF generator 112b. As will be explained in detail, control signals 130 or 130' represent an input signal to source RF generator 112a that indicates one or more operating characteristics or parameters of bias RF generator 112b. In various embodiments, a synchronization bias detector 134 senses the RF signal output from matching network 118b to load 132 and outputs a synchronization or trigger signal 130 to source RF generator 112a. In various embodiments, synchronization or trigger signal 130' may be output from bias RF generator 112b to source RF generator 112a, rather than trigger signal 130. A difference between trigger or synchronization signals 130, 130' may result from the effect of matching network 118b, which can adjust the phase between the input signal to and output signal from matching network. Signals 130, 130' include information about the operation of bias RF generator 112b that in various embodiments enables predictive responsiveness to address periodic fluctuations in the impedance of plasma chamber 132 caused by the bias RF generator 112b. When control signals 130, 130' are absent, RF generators 112a, 112b operate autonomously.

RF generators 112a, 112b include respective RF power sources or amplifiers 114a, 114b, RF sensors 116a, 116b, and processors, controllers, or control modules 120a, 120b. RF power sources 114a, 114b generate respective RF power signals 122a, 122b output to respective sensors 116a, 116b. Sensors 116a, 116b receive the output of RF power sources 114a, 114b and generate respective RF power signals $f_1$ and $f_2$. Sensors 116a, 116b also output signals that vary in accordance with various parameters sensed from load 132. While sensors 116a, 116b, are shown within respective RF generators 112a, 112b, RF sensors 116a, 116b can be located externally to the RF power generators 112a, 112b. Such external sensing can occur at the output of the RF generator, at the input of an impedance matching device located between the RF generator and the load, or between the output of the impedance matching device (including within the impedance matching device) and the load.

Sensors 116a, 116b detect various operating parameters and output signals X and Y. Sensors 116a, 116b may include voltage, current, and/or directional coupler sensors. Sensors 116a, 116b may detect (i) voltage V and current I and/or (ii) forward power $P_{FWD}$ output from respective power amplifiers 114a, 114b and/or RF generators 112a, 112b and reverse or reflected power $P_{REV}$ received from respective matching network 118a, 118b or load 132 connected to respective sensors 116a, 116b. The voltage V, current I, forward power $P_{FWD}$, and reverse power $P_{REV}$ may be scaled, filtered, or scaled and filtered versions of the actual voltage, current, forward power, and reverse power associated with the respective power sources 114a, 114b. Sensors 116a, 116b may be analog or digital sensors or a combination thereof. In a digital implementation, the sensors 116a, 116b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 116a, 116b generate sensor signals X, Y, which are received by respective controllers or power control modules 120a, 120b. Power control modules 120a, 120b process the respective X, Y signals 124a, 126a and 124b, 126b and generate one or a plurality of feedforward or feedback control signals 128a, 128b to respective power sources 114a, 114b. Power sources 114a, 114b adjust the RF power signals 122a, 122b based on received the one or plurality feedback or feedforward control signal. In various embodiments, power control modules 120a, 120b may communicate with matching networks 118a, 118b, respectively, via respective control signals 121a, 121b. Power control modules 120a, 120b may include, at least, proportional integral derivative (PID) controllers or subsets thereof and/or direct digital synthesis (DDS) component(s) and/or any of the various components described below in connection with the modules.

In various embodiments, power control modules 120a, 120b are PID controllers or subsets thereof and may include functions, processes, processors, or submodules. Control signals 128a, 128b may be drive signals and may include DC offset or rail voltage, voltage or current magnitude, frequency, and phase components. In various embodiments, feedback control signals 128a, 128b can be used as inputs to one or multiple control loops. In various embodiments, the multiple control loops can include a proportional-integral-derivative (PID) control loop for RF drive, and for rail voltage. In various embodiments, control signals 128a, 128b can be used in a Multiple Input Multiple Output (MIMO) control scheme. An example of a MIMO control scheme can be found with reference to U.S. Pat. No. 10,546,724, issued on Jan. 28, 2020, entitled Pulsed Bidirectional Radio Frequency Source/Load and assigned to the assignee of the present application, and incorporated by reference herein. In other embodiments, signals 128a, 128b can provide feedforward control as described in U.S. Pat. No. 10,049,857, assigned to the assignee of the present application and incorporated by reference herein.

In various embodiments, power supply system 110 can include controller 120'. Controller 120' may be disposed externally to either or both of RF generators 112a, 112b and may be referred to as external or common controller 120'. In various embodiments, controller 120' may implement one or a plurality of functions, processes, or algorithms described herein with respect to one or both of controllers 120a, 120b. Accordingly, controller 120' communicates with respective RF generators 112a, 112b via a pair of respective links 136, 138 which enable exchange of data and control signals, as appropriate, between controller 120' and RF generators 112a, 112b. For the various embodiments, controllers 120a, 120b, 120' can distributively and cooperatively provide analysis and control along with RF generators 112a, 112b. In various other embodiments, controller 120' can provide control of RF generators 112a, 112b, eliminating the need for the respective local controllers 120a, 120b.

In various embodiments, RF power source 114a, sensor 116a, controller 120a, and matching network 118a can be referred to as source RF power source 114a, source sensor 116a, source controller 120a, and source matching network 118a. Similarly in various embodiments, RF power source 114b, sensor 116b, controller 120b, and matching network 118b can be referred to as bias RF power source 114b, bias sensor 116b, bias controller 120b, and bias matching network 118b. In various embodiments and as described above, the source term refers to the RF generator that generates a plasma, and the bias term refers to the RF generator that tunes the plasma Ion Energy Distribution Function (IEDF).

In various embodiments, the source and bias RF power supplies operate at different frequencies. In various embodiments, the source RF power supply operates at a higher frequency than the bias RF power supply. In various other embodiments, the source and bias RF power supplies operate at the same frequencies or substantially the same frequencies.

According to various embodiments, source RF generator 112a and bias RF generator 112b may include multiple ports to communicate externally. Source RF generator 112a includes a pulse synchronization output port 140, a digital communication port 142, and an RF output port 144. Bias RF generator 112b includes an RF input port 148, a digital communication port 150, and a pulse synchronization input port 152. Pulse synchronization output port 140 outputs a pulse synchronization signal 156 to pulse synchronization input port 152 of bias RF generator 112b. Digital communication port 142 of source RF generator 112a and digital communication port 150 of bias RF generator 112b communicate via a digital communication link 157. RF output port 144 generates a RF control signal 158 input to RF input port 148. In various embodiments, RF control signal 158 is substantially the same as the RF control signal controlling source RF generator 112a. In various other embodiments, RF control signal 158 is the same as the RF control signal controlling source RF generator 112a, but is phase shifted within source RF generator 112a in accordance with a requested phase shift generated by bias RF generator 112b. Thus, in various embodiments, source RF generator 112a and bias RF generator 112b are driven by substantially identical RF control signals or by substantially identical RF control signal phase shifted by a predetermined amount.

Figure 2:
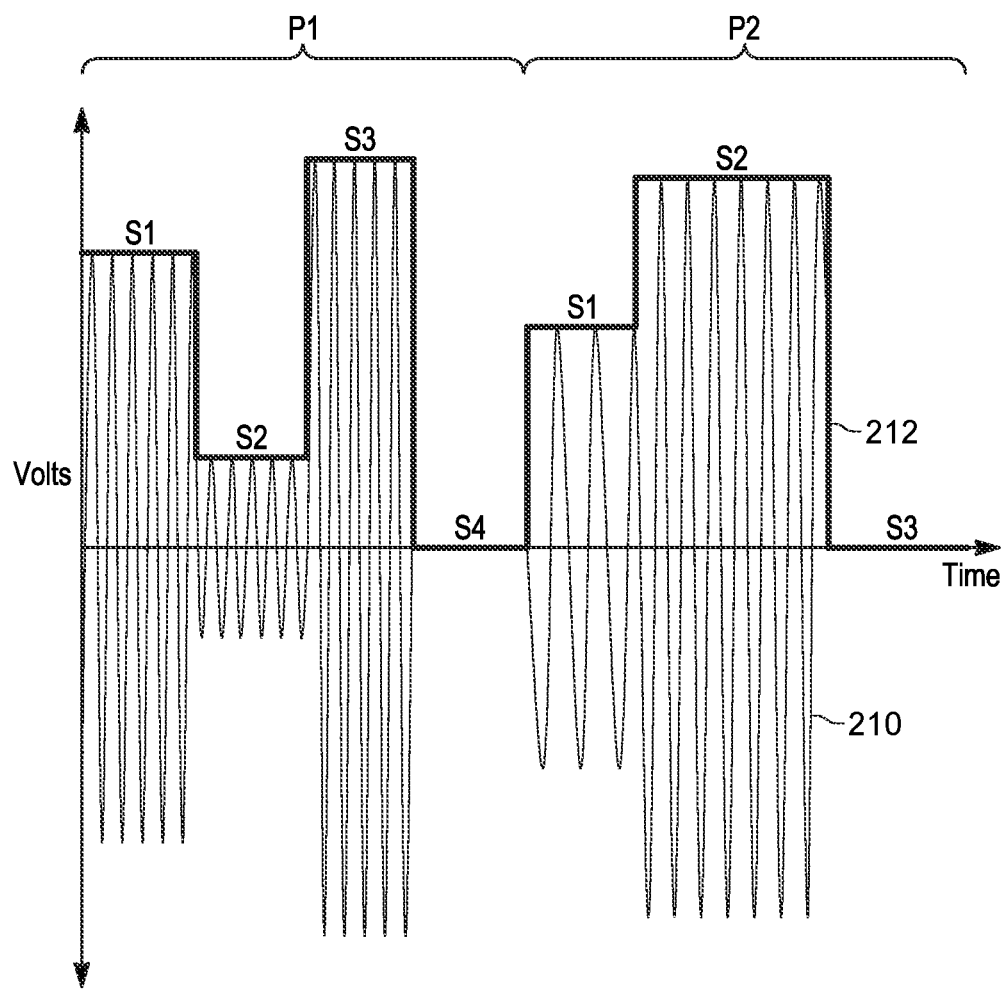
FIG. 2 shows waveforms of a RF signal and a pulse modulating the RF signal.

FIG. 2 depicts a plot of voltage versus time to describe a pulse mode of operation for delivering power to a load, such as load 132 of FIG. 1. More particularly, FIG. 2 depicts two-multistate pulses P1, P2 of a pulse signal 212 having a respective plurality of states S1-S4 and S1-S3. In FIG. 2, RF signal 210 is modulated by pulses P1 and P2. As shown at states S1-S3 of P1 and S1-S2 of P2, when the pulses are ON, RF generator 112 outputs RF signal 210 having an amplitude defined by the pulse magnitude at each state. Conversely, during states S4 of P1 and S3 of P2, the pulses are OFF, and RF generator 112 does not output RF signal 210. Pulses P1, P2 can repeat at a constant duty cycle or a variable duty cycle, and states S1-S4 of each pulse P1, P2 may have the same or varying amplitudes and widths. Further, pulse signal 212 need not be embodied as a square wave as shown in FIG. 2. By way of non-limiting example, pulse 212 may be trapezoidal, triangular, or gaussian in shape. Further yet, pulses P1, P2 can have multiple states S1, . . . , Sn of varying amplitude, duration, and shape. States S1, . . . , Sn may repeat within a fixed or variable period. Also shown in FIG. 2, RF signal 210 operates at a frequency that varies between states or within a state.

Figure 3:
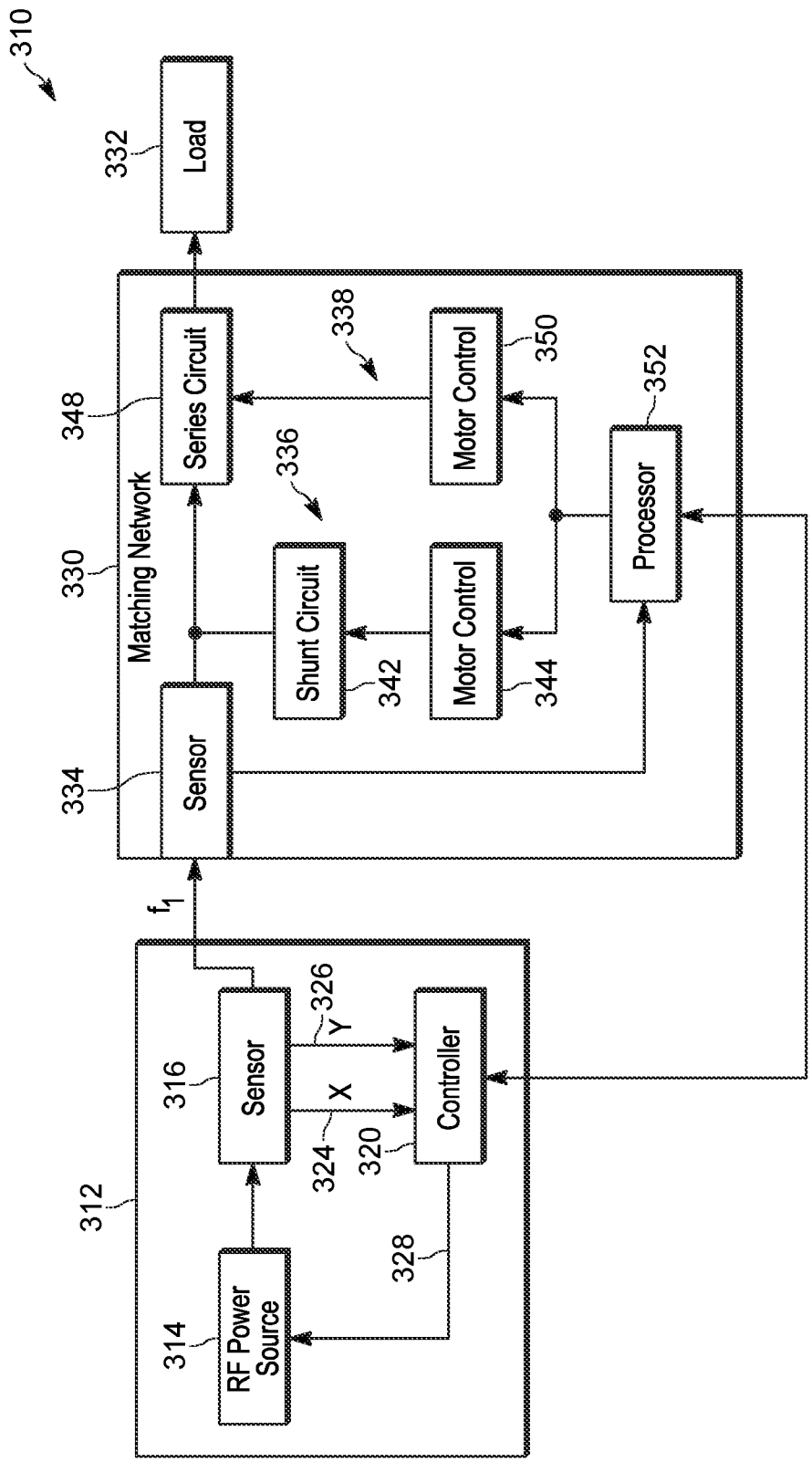
FIG. 3 shows a RF power delivery system providing a RF signal to a load via a matching network using a conventional configuration.

FIG. 3 depicts RF power delivery system 310 including a RF generator 312, which may be as described above with respect to FIG. 1, matching network or impedance matching network 330, which may be as described above with respect to impedance matching network 118 of FIG. 1, for delivering power to a load 332, which may be as described above with respect to load 132 of FIG. 1. Impedance matching network 330 is arranged as a conventional matching network and includes sensor 334, shunt leg 336, and series leg 338. Shunt leg 336 includes shunt circuit 342 and motor controller 344. Motor controller 344 receives input signals, as will be described herein, and generates a control signal to shunt circuit 342. Shunt circuit 342 includes a variable reactance, such as a variable capacitor or a variable inductor, in order to vary the impedance between RF generator 312 and load 332. As described herein shunt circuit 342 includes a variable vacuum capacitor (VVC) having a motor controlled by motor controller 344. Varying the position of the VVC of shunt circuit 342 varies the capacitance in order to vary the impedance match between RF generator 312 and load 332. Similarly, series circuit 348 includes a second variable vacuum capacitor (VVC) that receives control signals from motor controller 350 in order to vary the impedance of series leg 338. Varying the position of the VVC of series circuit 348 varies the capacitance in order to vary the impedance match between RF generator 312 and load 332. Processor 352 communicates with controller 320 of RF generator 312 and sensor 334 of impedance matching network 330. Processor 352 receives input from sensor 334 and generates command signals to respective motor controller 344 and motor controller 350.

In a conventional configuration, impedance matching network 330 operates to achieve an impedance match between RF generator 312 and load 332 by measuring the complex reflection coefficient, Gamma or Γ, based on output signals from sensor 334. Sensor 334 may be configured as described above with respect to sensors 116 of FIG. 1. The reflection coefficient, Gamma or Γ, may be represented as shown in Equation (1):

$$\Gamma = \frac{Z - Z_0}{Z + Z_0} \quad (1)$$

where:
Z is the measured impedance; and
$Z_0$ is the characteristic impedance of the transmission line over which the impedance Z is measured.

In a conventional approach, processor 352 generates command signals to motor controller 344 and motor controller 350 to control impedance of impedance matching network 330 so that the magnitude of Gamma approaches zero in order to minimize power reflected from load 332. In the case of a multistate pulse as described above with respect to FIG. 2, the various amplitudes of each state S1, S2, S3, S4 can impact the impedance match between RF generator 312 and load 332. Further, varying the frequency, such as varying the frequency of RF signal 210 of FIG. 2, further causes variation in the impedance between RF generator 312 and load 332.

In the conventional impedance control approach implemented in FIG. 3, the reflection coefficient, Gamma, of each state, such as S1, S2, S3, S4 of FIG. 2, is measured. Each measured Gamma is adjusted by a predetermined gain, and the adjusted Gammas are added to generate a combined reflection coefficient. Processor 352 generates control signals to motor controller 344 and motor controller 350 in order to minimize the combined reflection coefficient. The motor control commands in turn adjust the VVC of respective shunt circuit 342 and series circuit 348 to reduce the compound reflection coefficient.

In a typical pulsing configuration, the frequency of, for example, pulses P1, P2 may vary from approximately 100 Hz to kHz so that the capacitance of respective shunt circuit 342 and series circuit 348 may be adjusted according to the impedance change for each state. In order to adjust the impedance, the VVC of each shunt circuit 342 and series circuit 348 are adjusted on the order of a few milliseconds to several milliseconds. Accordingly, the adjustment speed of each VVC limits the speed at which reflected power is reduced in each state since the motor of the VVC rotates at approximately 5-7 rotations per second. Further, using Gamma as described above in order to arrive at an impedance match limits the speed at which an impedance match can be achieved. The impedance match can be further improved by varying the frequency of the RF signal, such as RF signal 210 of FIG. 2, in order to implement frequency tuning of the impedance, but remains limited in its effect by the speed and accuracy of the Gamma-based, conventional approach.

Even with the combined impedance match adjustment by varying shunt circuit 342 and series circuit 348 of impedance matching network 330, and the frequency of the RF signal to provide frequency tuning, the conventional approach does not always arrive at the desired impedance match, such as 50 ohms. Further, when the conventional impedance match adjustment does arrive at a match, it may not arrive at the desired impedance match with sufficient speed.

Figure 4:
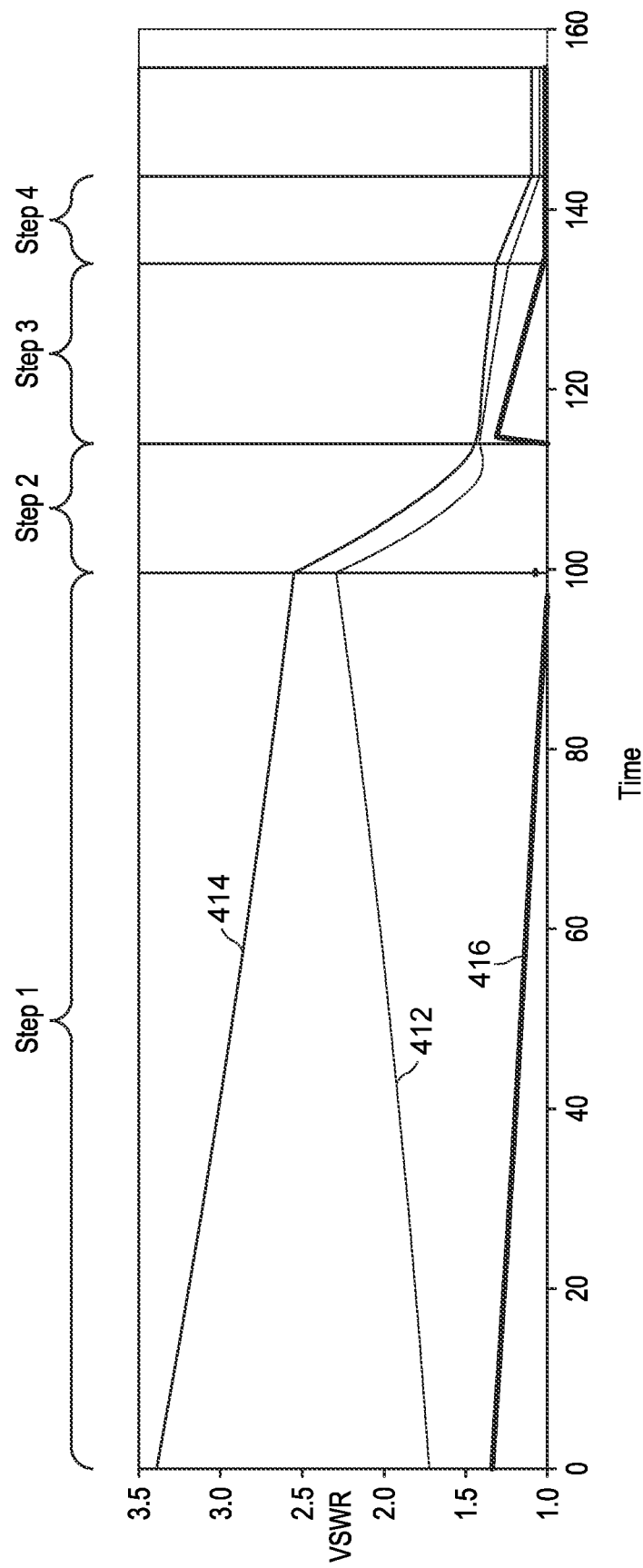
FIG. 4 is a plot showing timing for completing an impedance match for a multistate pulse using a conventional impedance matching approach.

FIG. 4 depicts a timeline indicating the time required to achieve an impedance match accordance with the conventional approach. In FIG. 4, a time in units is shown on the x-axis, and the y-axis indicates a voltage standing wave ratio (VSWR). Waveform 412 depicts VSWR during a first state S1 of a multistate pulse having a pair of states, S1 and S2. Waveform 414 represents the VSWR during a second state S2 of the two state pulse. Waveform 416 indicates a virtual VSWR resulting from the combination of the VSWRs of state S1 and state S2.

FIG. 4 also depicts the steps required to reach an impedance match and the resulting effect on the respective waveforms 412, 414, 416. Step 1 indicates a first capacitance tuning step, Step 2 indicates a first frequency tuning step, Step 3 indicates a second capacitance tuning step, and Step 4 indicates a second frequency tuning step. As can be seen in FIG. 4, each step reduces VSWR for S1, shown at waveform 412, S2, shown at waveform 414, and composite VSWR, shown at waveform 416. A match is completed at the conclusion of Step 4 at approximately 145 time units. Thus, FIG. 4, represents the time required for the VSWR to be minimized for each of S1, S2, and composite VSWR.

The conventional approach to impedance matching described above does reach an impedance match, but using Gamma to determine the impedance matching can yield errors in the first iteration, Step 1 and Step 2. Failure to reach an impedance match after a first iteration requires a second iteration, Step 3 and Step 4, requiring additional time to reach an impedance match. Thus, the conventional approach is inherently less accurate requires longer to arrive at an impedance match.

Figure 5:
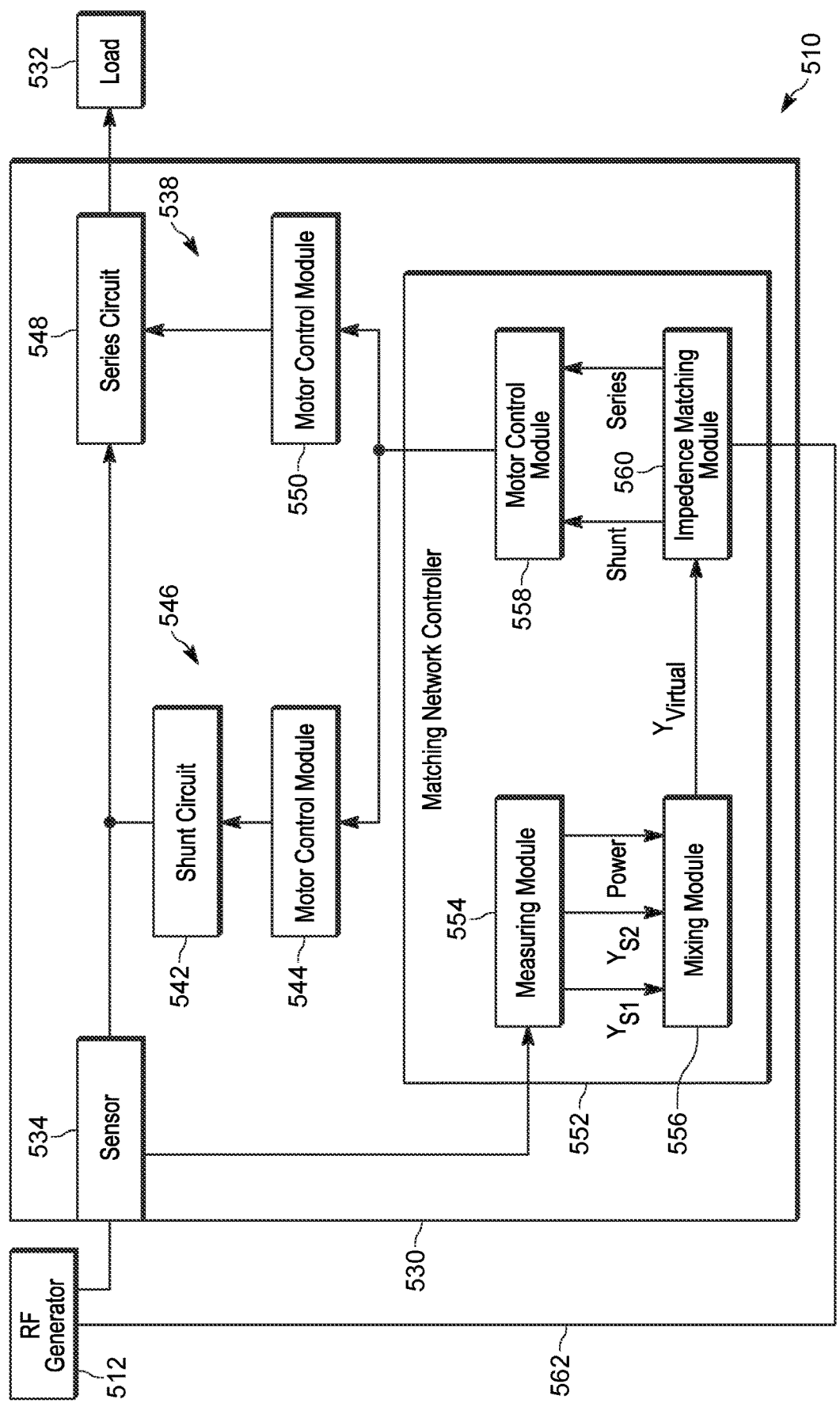
FIG. 5 shows a RF power delivery system having a matching network arranged according to various embodiments of the present disclosure.

FIG. 5 depicts RF power delivery system 510 including RF generator 512 and impedance matching network 530 delivering power to load 532. RF generator 512 corresponds to any of generators 112 described in FIG. 1. Similarly, load 532 corresponds to load 132 of FIG. 1. The configuration described herein with respect to the following figures can be implemented in RF generator systems having one, two, or more RF generators providing power to one, two, or more loads, and matching network or impedance matching network 530 described in FIG. 5 and the following figures can be implemented in one or more of matching networks between the one, two, or more RF generators and the one, two, or more loads.

Impedance matching network 530 includes sensor 534, as described above, which outputs voltage, current, or forward power and reverse power to measuring module 554 of matching network controller 552. Measuring module 554 receives the output from sensor 534 and generates one or a plurality of admittances $Y_{s1}$, $Y_{s2}$, and power. $Y_{s1}$, $Y_{s2}$ correspond to admittances measured for respective states S1 and S2 of a pulse having two states. However, measuring module 554 can output an admittance for each state of a multistate pulse output by RF generator 512, where the pulse includes greater than two states. Measuring module 554, in various embodiments, can also determine other quantities including voltage, current, phase, and frequency.

Output from measuring module 554 is input to mixing module 556. Mixing module 556 determines a composite or virtual admittance $Y_{virtual}$ based on the combined admittances for state S1 $Y_{s1}$ and state S2 $Y_{s2}$. Mixing module 556 outputs the virtual admittance $Y_{virtual}$ to impedance matching module 560. Impedance matching module 560 determines desired capacitance values for the respective shunt leg 546 and series leg 538. The commanded capacitance values are input to motor control module 558, which generates motor commands to each of respective motor control modules 544, 550 to control the capacitance of respective shunt leg 546 and series leg 538. Motor control modules 544, 550 generate control commands to respective shunt circuit 342 and series circuit 348 in order to control respective the VVCs of each circuit to vary the capacitance and, therefore, the impedance match between RF generator 512 and load 532. In various embodiments, impedance matching module 560 communicates with RF generator 512 over a communications link 562 to command a frequency of the RF signal output by RF generator 512 to frequently tune for impedance matching. In other embodiments, RF generator 512 may determine an operating frequency to frequency tune for impedance matching.

Using admittance values from measuring module 554, mixing module 556 outputs a virtual admittance $Y_{virtual}$ determined in accordance with Equation (2):

$$Y_{virtual} = \text{Gain} Y_{S1} + (1-\text{Gain}) Y_{S2} \qquad (2)$$

where:
Gain is a multiplier value; and
$Y_{S1}$ and $Y_{S2}$ are the admittances for respective first and second pulse states S1, S2.
The admittance Y is defined as shown in Equation (3):

$$Y = \frac{1}{Z} \qquad (3)$$

where Z is impedance.
The gain terms $G_n$ of Equation (2) can be defined for the case of a two state pulse as shown in Equations (4) and (5):

$$G_1 = \left(\alpha\left(1 - w\left(|P_{R_{S1}}|\right)\right) + \left(\frac{P_{S1}}{P_{S1} + P_{S2}}\right) w\left(|P_{R_{S1}}|\right)\right) \qquad (4)$$

and $$G_2 = (1-\alpha)\left(1 - w\left(|P_{R_{S2}}|\right)\right) + \left(\frac{P_{S1}}{P_{S1} + P_{S2}}\right) w\left(|P_{R_{S2}}|\right) \qquad (5)$$

where:
$\alpha$ is a gain value, typically set by the user;
$P_{S_n}$ is the measured forward power for respective pulse state $S_n$; and
$w(|P_{R_{S_n}}|)$ is a gain weighting function defined as shown in Equation (6):

$$w(|P_{R_{Sn}}|) = \frac{1}{1 + e^{-a \times (|P_{R_{Sn}}| - b)}} \quad (6)$$

where:
a is a coefficient for the gain of the weighting function, typically set by user;
b is an offset parameter, typically set by the user; and
$P_{R_{Sn}}$ is the ratio of the reverse $P_{REV}$ power to the forward power $P_{FWD}$ for the pulse state $S_n$, which can be defined as in Equation (7):

$$P_{R_{Sn}} = \left| \frac{P_{REV_{Sn}}}{P_{FWD_{Sn}}} \right| = \sqrt{\left(\frac{P_{REV_{Sn}}}{P_{FWD_{Sn}}}\right)^2} \quad (7)$$

where:
$P_{REV_{Sn}}$ is the reverse power during state $S_n$; and
$P_{FWD_{Sn}}$ is the forward power during state $S_n$.
Combining Equations (4), (5), and (6), a new target admittance new is defined as in Equation (8):

$$Y_{new} = \left\{ \left( \alpha(1 - w(|P_{R_{S1}}|)) + \left(\frac{P_{S1}}{P_{S1} + P_{S2}}\right) w(|P_{R_{S1}}|) \right) \times Y_{S1} + \left\{ (1-\alpha)(1 - w(|P_{R_{S2}}|)) + \left(\frac{P_{S1}}{P_{S1} + P_{S2}}\right) w(|P_{R_{S2}}|) \right\} \times Y_{S2} \quad (8)$$

For greater than two states, the virtual admittance can be written as shown in Equation (9):

$$Y_{virtual} = G_1 Y_{S1} + G_2 Y_{S2} + G_3 Y_{S3} + \ldots G_n Y_{Sn} \quad (9)$$

where:
$G_n$ is a gain multiplier value for the respective pulse state $S_n$; and
$Y_{Sn}$ the admittances for respective pulse state $S_n$.
In the generalized representation of Equation (9), the gain terms are constrained by the following Equation (10):

$$G_1 + G_2 + G_3 + \ldots + G_n = 1 \quad (10)$$

Figure 6:
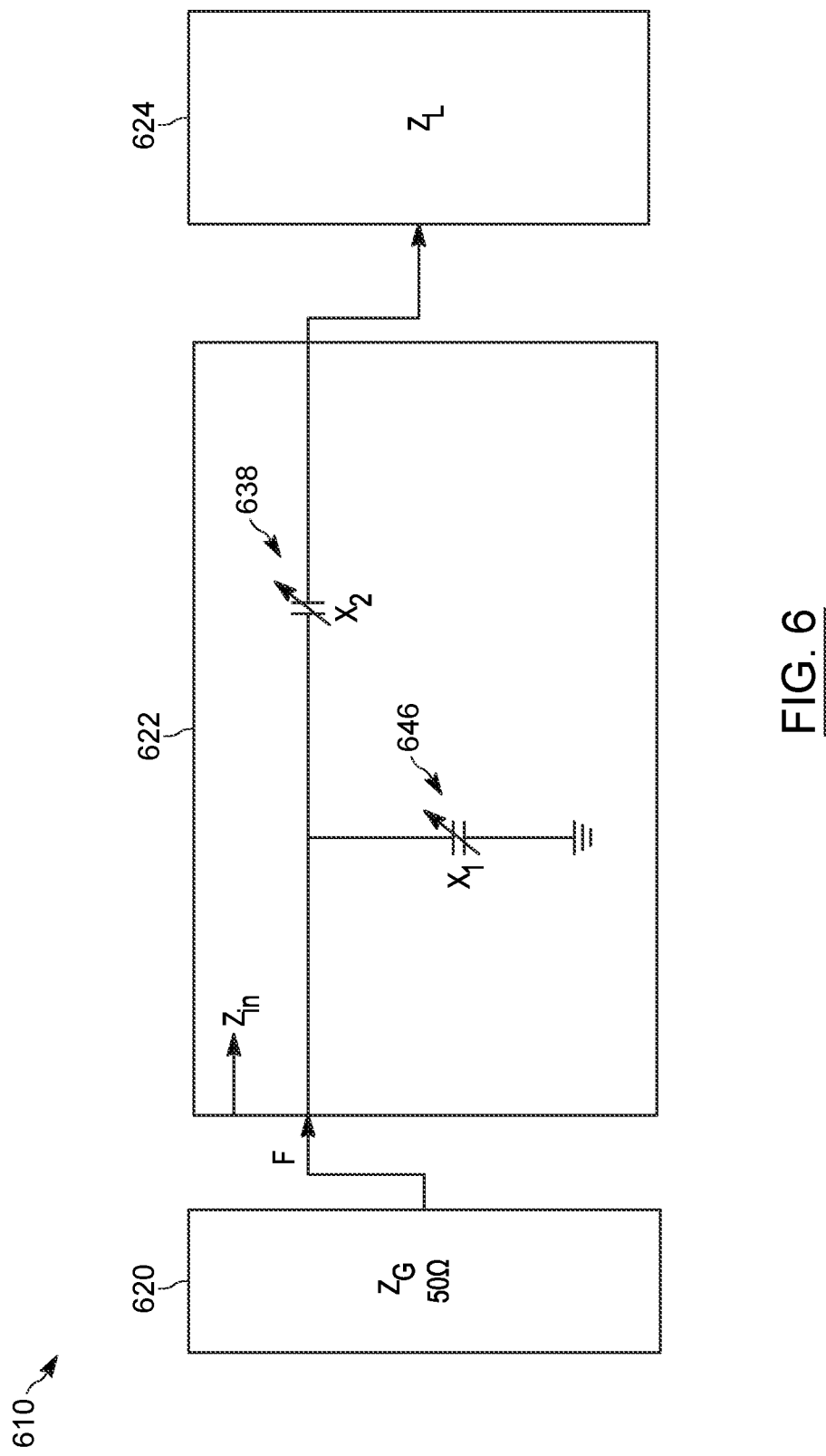
FIG. 6 shows a RF power delivery system having a matching network arranged in according to various embodiments of the present disclosure.

FIG. 6 shows a schematic block diagram of a network 610 for matching a fixed impedance $Z_G=50$ ohms of RF generator 620 with a load 624 having a variable impedance Z L and matching network or impedance matching network 622 interposed between RF generator 620 and load 624. RF generator 620 may be similar to RF generators 112, 312, 512 described above and output a multistate, pulsed RF signal having a frequency f to impedance matching network 622. Impedance matching network 622 has an impedance $Z_{in}$. Impedance matching network 622 includes a capacitance with a variable impedance $X_1$ in shunt leg 646 and a capacitance with a variable impedance $X_2$ in series leg 638.
The input impedance $Z_{in}$ is defined as in Equation (11):

$$Z_{in} = \frac{X_1(Z_L + X_2)}{X_1 + (Z_L + X_2)} \quad (11)$$

where:
$X_1$ is the impedance of the shunt leg; and
$X_2$ is the impedance of the series leg; and
$Z_L$ is the load impedance.
The respective impedances $X_1$ and $X_2$ can be defined generally as X n shown in Equation (12):

$$X_n = \frac{1}{j2\pi f C_n} \quad (12)$$

where:
f is the frequency of the RF signal; and
$C_n$ is the capacitance of the capacitance of the respective shunt and series circuits $X_n$, where n=1 or 2 for a two state pulse.
Thus impedances $Z_{in_{S1}}$ and $Z_{in_{S2}}$ for respective frequencies $f_1$ and $f_2$ of respective pulse states $S_1$, $S_2$ of a two state pulse can be represented as shown in respective Equations (13) and (14):

$$Z_{in_{S1}} = \frac{\frac{1}{j2\pi f_1 C_1}\left(Z_{L_{S1}} + \frac{1}{j2\pi f_1 C_2}\right)}{\frac{1}{j2\pi f_1 C_1} + \left(Z_{L_{S1}} + \frac{1}{j2\pi f_1 C_2}\right)} = 50\Omega \quad (13)$$

and $$Z_{in_{S2}} = \frac{\frac{1}{j2\pi f_2 C_1}\left(Z_{L_{S2}} + \frac{1}{j2\pi f_2 C_2}\right)}{\frac{1}{j2\pi f_2 C_1} + \left(Z_{L_{S2}} + \frac{1}{j2\pi f_2 C_2}\right)} = 50\Omega \quad (14)$$

where:
$Z_{L_{Sn}}$ is the load impedance for pulse state Sn;
$f_n$ is the frequency of the RF signal for pulse state Sn;
$C_1$ is the capacitance of the shunt circuit of the matching network; and
$C_2$ is the capacitance of the series circuit of the matching network.
A solution satisfying $Z_{in_{S1}}=50\Omega$ cannot satisfy $Z_{in_{S2}}=50\Omega$. These equations can be expanded for pulses with greater than two states.

The virtual admittance is generated by mixing the admittances of state S1 and state S2 measured at the input port of impedance matching network 622. Further, the reflected power of each state that could not be reduced using the adjustment capacitance can be addressed by changing the frequency of RF signal output by RF generator 620. The equations for $Z_{in_{S1}}$ and $Z_{in_{S2}}$ can be used to determine the capacitance values $C_1$ and $C_2$ and the frequency $f_n$ for determining an impedance match, such as by impedance matching module 560 of FIG. 5.

Figure 7:
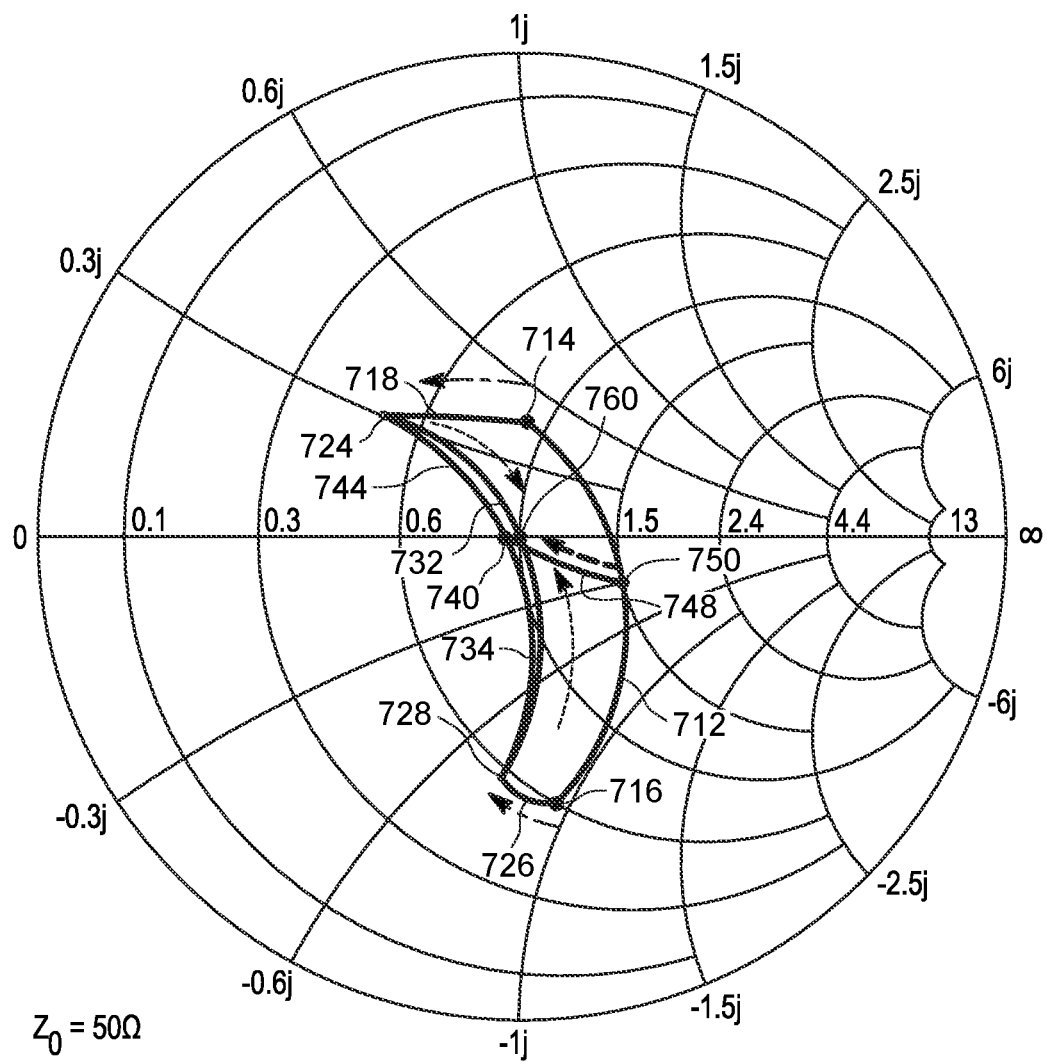
FIG. 7 shows impedance matching plots for a multistate pulse for an impedance matching network according to various embodiments the present disclosure.

FIG. 7 depicts trajectories generated in accordance with FIG. 6 as described above. With reference to FIG. 7, one trajectory indicates mixing preset 712. Mixing preset 712 represents an initial condition generated by the set of points resulting from varying the gain in Equation (2) from 0 to 1 for a two state pulse having an admittance at state S1 and an admittance at state S2. Virtual trajectory 748 indicates the virtual trajectory at Gain=0.5 at point 750 of admittance mixing preset 712 to point 740 along admittance mixing target 744. Admittance mixing target 744 results from translating $Z_{S1}$ 714 (Gain=1) and $Z_{S2}$ 716 (Gain=0) similarly to the translation of point 750 to point 740. Translation of mixing preset 712 to admittance mixing target 744 occurs through capacitance impedance tuning of impedance matching network 530. Capacitance impedance tuning occurs by adjusting capacitive elements of shunt circuit 542 and series circuit 548. The impedance trajectory 718 of $Z_{S1}$ from point 714 to end point 724 of admittance mixing target 744 represents capacitance tuning of state S1. Similarly, the impedance trajectory 726 of $Z_{S2}$ point 716 to end point 728 of admittance mixing target 744 represents capacitance tuning of state S2. Frequency circle 732 represents frequency tuning during state S1 to origin 760. Likewise, frequency circle 734 represents frequency tuning during state S2 to origin 760 or 50 ohms impedance. As can be seen at FIG. 7, the impedance match convergences to 50 ohm relatively quickly when using admittance.

Figure 8:
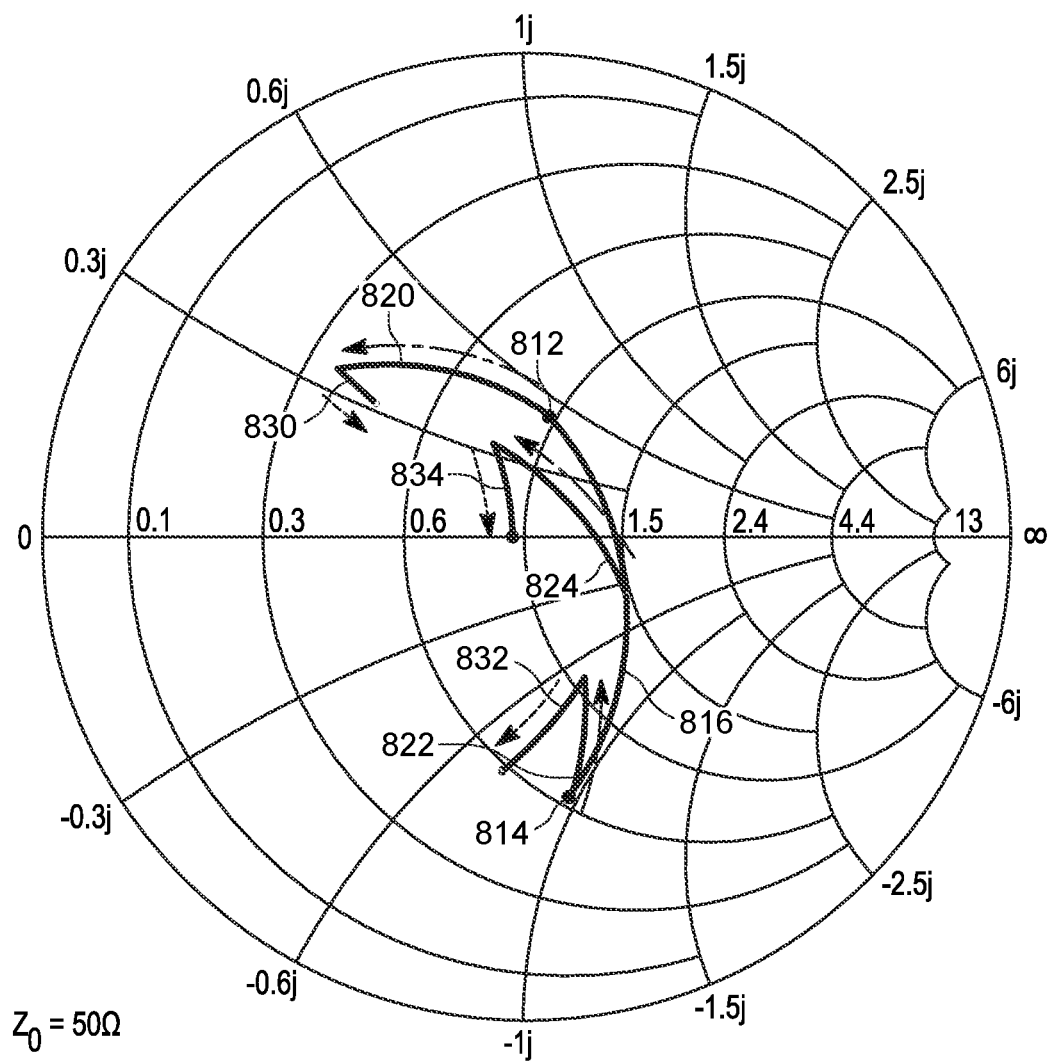
FIG. 8 shows impedance matching plots for a capacitive tuning impedance match for a multistate pulse for an impedance matching network arranged in accordance to the various embodiments of the present disclosure.

FIG. 8 depicts an impedance change according to variation in capacitance of the impedance matching network according to a first step in impedance matching according to the present disclosure. The admittance mixing preset 816 is translated in accordance with the virtual trajectory shown by arcs 824, 834 to arrive at an admittance mixing target (not shown). In FIG. 8, point 812 indicates the impedance $Z_{S1}$ at state S1, and point 814 indicates impedance $Z_{S2}$ at state S2. A portion of a circle indicates an admittance mixing preset 816 between the impedances $Z_{S1}$, $Z_{S2}$ at respective states S1, S2. During state S1, as capacitance changes, such as series capacitance C2 (in series circuit 548), the impedance trajectory responsive to the change in capacitance of the series leg is shown by arc 820, and the impedance trajectory of state S2 in response to adjustment of series capacitance C2 is shown by arc 822. The admittance virtual trajectory change from adjustment of series capacitance C2 is shown at arc 824. Similarly, the admittance virtual trajectory of impedance $Z_{S1}$ of state S1 in response to a change in the shunt capacitance C1 (of shunt circuit 542) is shown at arc 830, and the admittance virtual trajectory of impedance $Z_{S2}$ of state S2 during a change in the shunt capacitance C2 is shown at arc 832. The change in the admittance virtual trajectory in response to adjustments of C1 is shown at 834.

Figure 9:
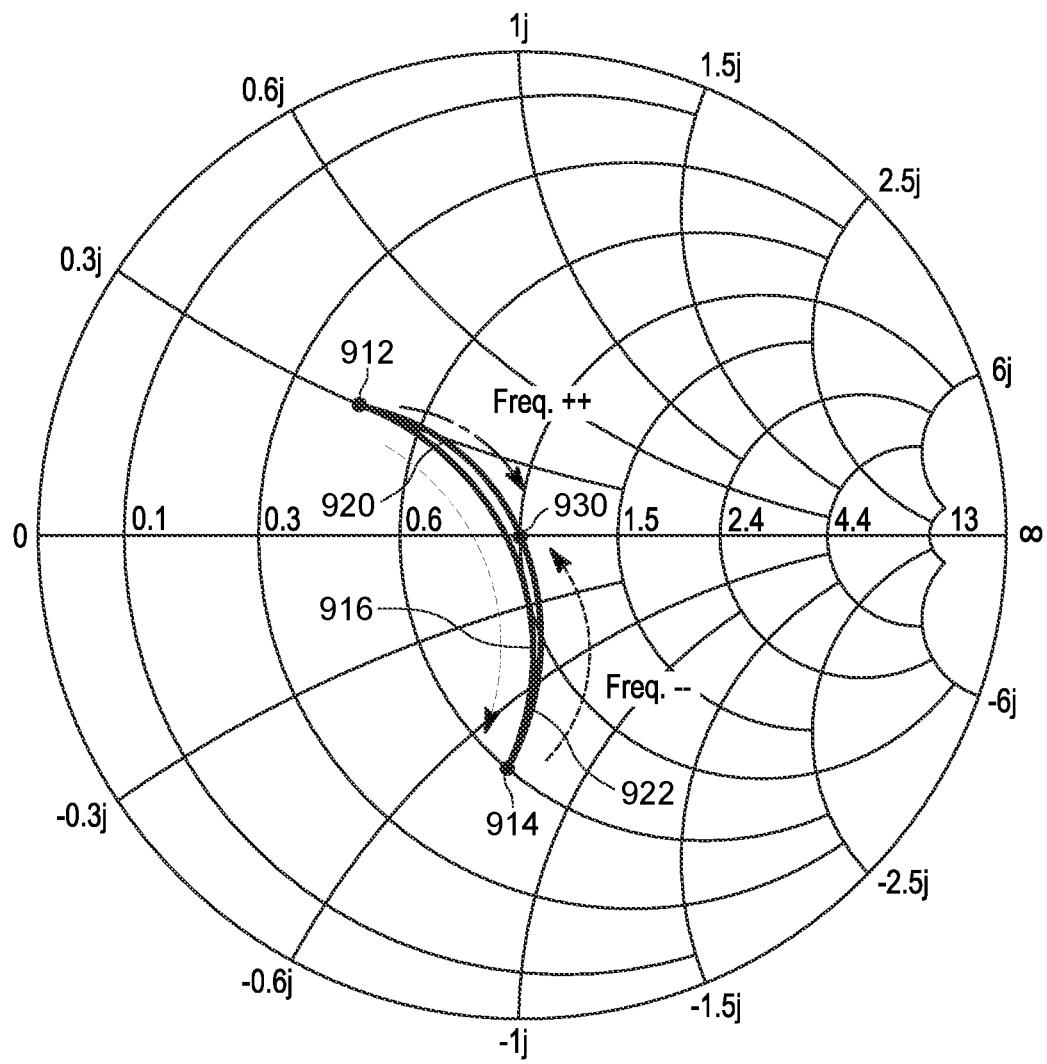
FIG. 9 shows impedance matching plots for a frequency tuning impedance match for a multistate pulse for an impedance network arranged in accordance with various embodiments of the present disclosure.

FIG. 9 depicts an impedance change according to variation in frequency of the RF signal according to a second step in impedance matching according to the present disclosure. FIG. 9 depicts impedance trajectories for frequency tuning starting from admittance mixing target 916. Point 912 is the position of the impedance $Z_{S1}$ of S1 (Gain=1), and point 914 is the position of the impedance $Z_{S2}$ for S2 (Gain=0). The trajectory along admittance mixing target 916 is from 912 to 914. As can be noted, the trajectory of admittance mixing target 916 closely approximates the frequency circles 920, 922 for respective states S1, S2. Thus, the mixing trajectory is closer to the frequency tuning trajectory than with conventional approaches. Thus, the approach described using admittance for impedance matching provides improved accuracy so that fewer iterations are required to arrive at or near an impedance match of 50 ohms at point 930.

Figure 10:
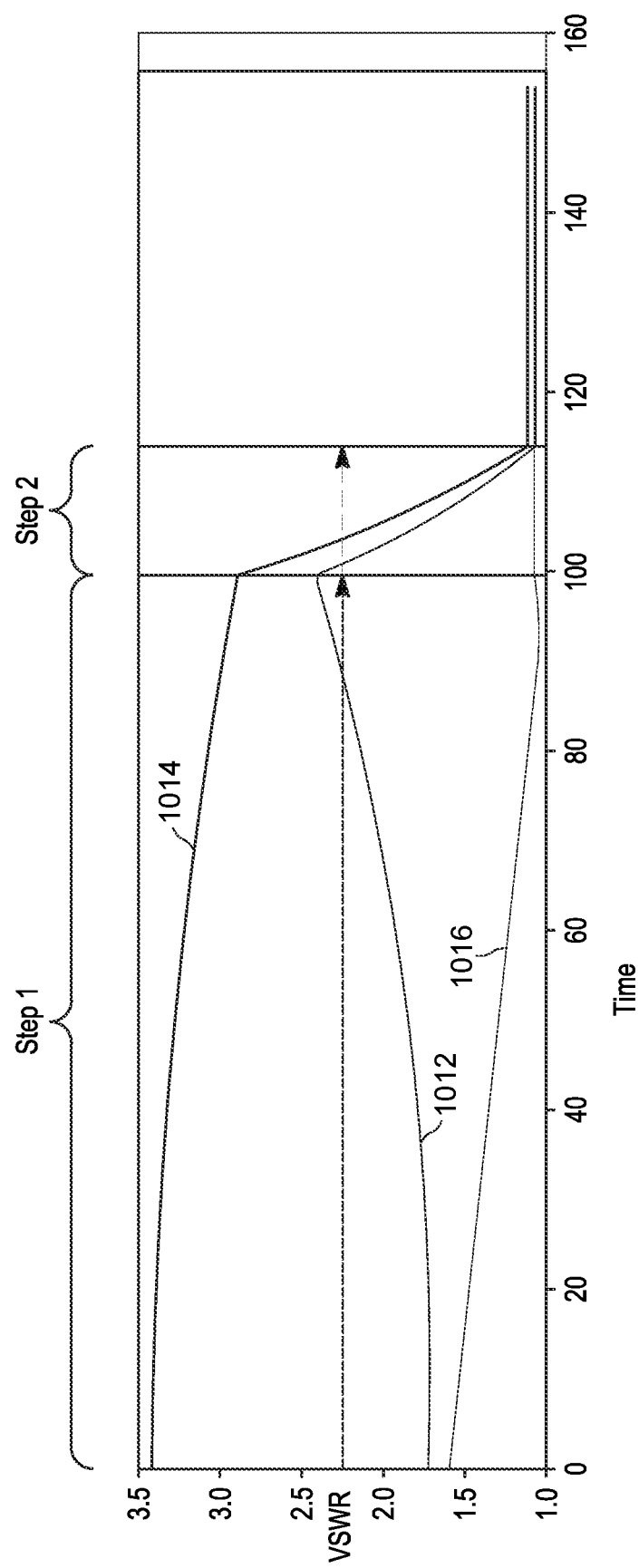
FIG. 10 shows a timing diagram depicting the time to arrive at an impedance match using the matching approach arranged in according to various embodiments of present disclosure.

FIG. 10 depicts a timing diagram depicting an example timing to an impedance match when using the admittance-based impedance matching approach described in the present disclosure. Similarly, to FIG. 4, units of time are shown on the x-axis and the VSWR is shown on the y-axis. Waveform 1012 indicates the VSWR of state S1, and waveform 1014 represents the VSWR of state S2. Waveform 1016 indicates the VSWR using an admittance-based approach described herein to achieve an impedance match. In Step 1, a capacitance tuning step is executed. In Step 2, a frequency tuning step is executed. The matching is complete at the conclusion of step 2 at approximately 115 time units. Thus, when compared to FIG. 4, the admittance-based approach described herein requires fewer steps and less time to arrive at an impedance match. Thus, the admittance-based approach described herein is both more accurate and faster than the previous matching approach using Gamma.

Figure 11:
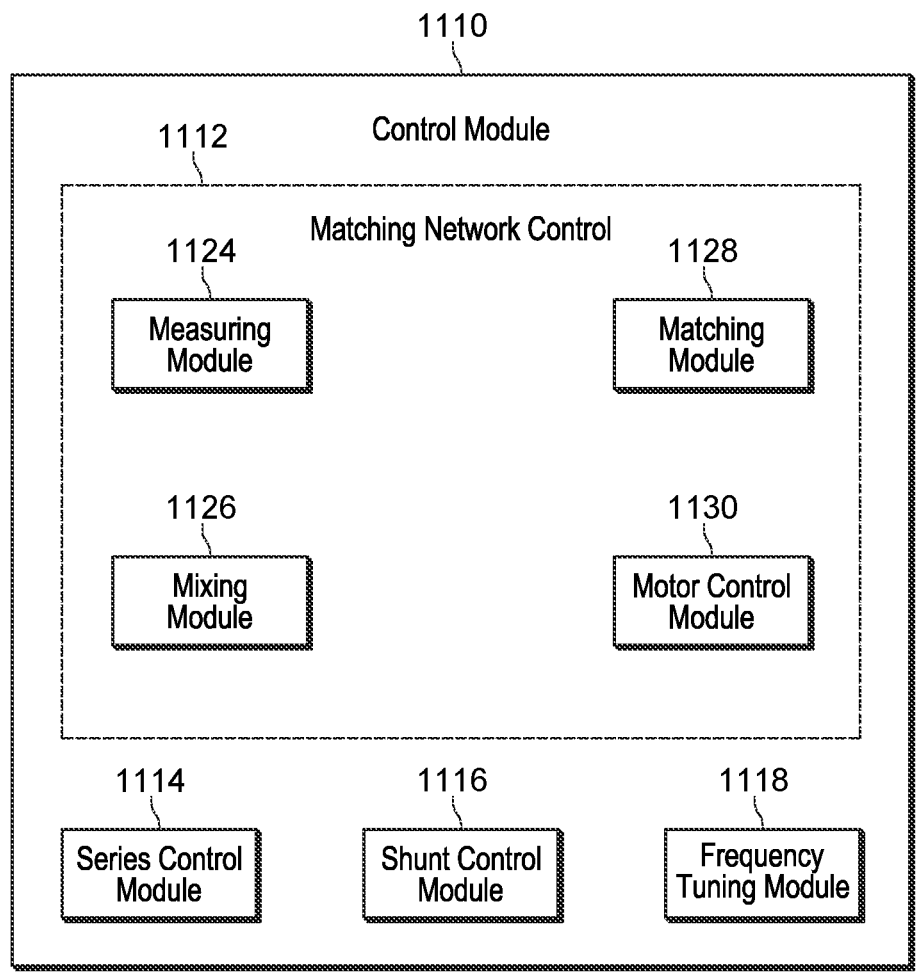
FIG. 11 shows a functional block diagram of an example control module arranged in accordance with various embodiments of the present disclosure.

FIG. 11 incorporates various components of FIGS. 1, 2, and 5-10. Control module 1110 may include matching network module 1112, series control module 1114, shunt control module 1116, and frequency tuning module 1118. Matching network control module 1112 includes measuring module 1124, mixing module 1126, matching module 1128, and motor control module 1130. In various embodiments, control module 1110 includes one or a plurality of processors that execute code associated with the module sections or modules 1110, 1112, 1114, 1116, 1118, 1124, 1126, 1128, and 1130. Operation of the module sections or modules 1110, 1112, 1114, 1116, 1118, 1124, 1126, 1128, and 1130, is described below with respect to the method of FIG. 12.

For further defined structure of controllers 120a, 120b, and 120' of FIG. 1 and of 552 of FIG. 5, see the flow chart of FIG. 12 and the below provided definition for the term "module". The systems disclosed herein may be operated using numerous methods, examples, and various control system methods of which are illustrated in FIGS. 1, 2, and 5-10. Although the following operations are primarily described with respect to the implementations of FIGS. 1 and 5, the operations may be easily modified to apply to other implementations of the present disclosure. The operations may be iteratively performed. Although the following operations are shown and primarily described as being performed sequentially, one or more of the following operations may be performed while one or more of the other operations are being performed.

Figure 12:
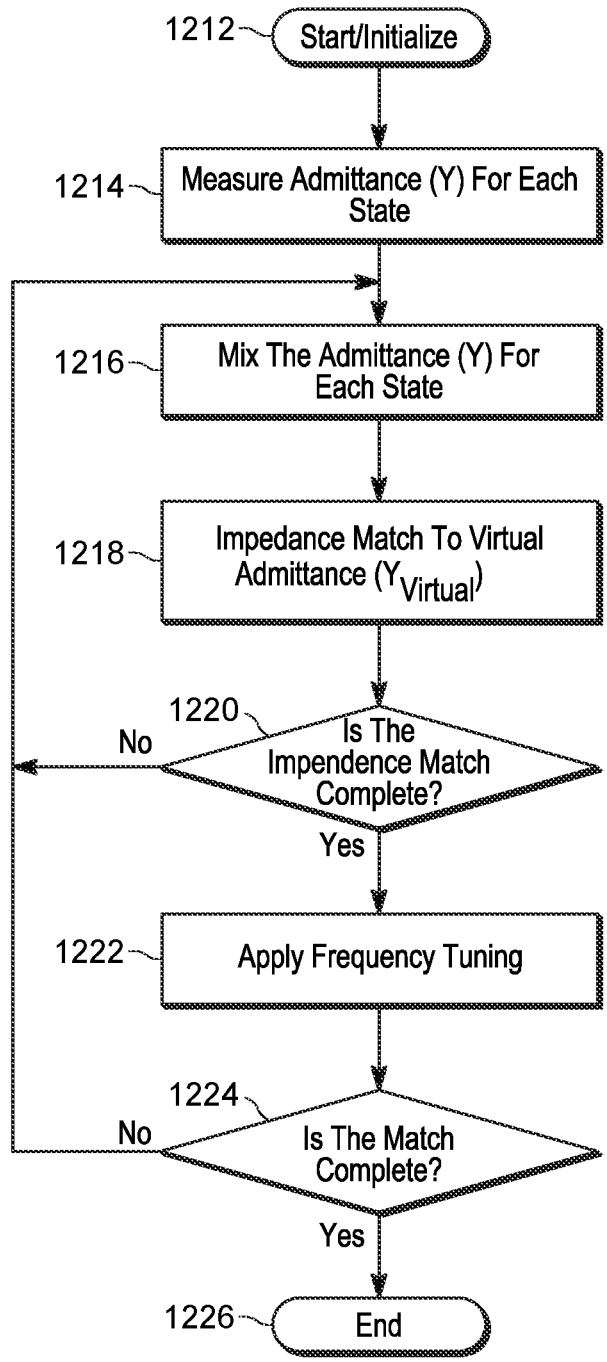
FIG. 12 shows a flow chart of operation of a control system arranged in accordance with various embodiments of the present disclosure.

FIG. 12 shows a flow chart of a control system 1210 for performing admittance-base impedance control for, for example, the power delivery systems described above. Control begins at block 1212 where the process is initialized and proceeds to block 1214. At block 1214, the admittance (Y) is measured for each state of a pulse. The pulse may include two or more states as described above. Control proceeds to block 1216 where the admittance (Y) for each state is mixed to generate a virtual admittance $Y_{virtual}$. Control next proceeds to block 1218, which determines an impedance match based upon the virtual admittance $Y_{virtual}$. For the impedance match, block 1218 generates control commands to one or more motor control modules, such as motor control module 558 of FIG. 5, to apply capacitance adjustments to the impedance matching network. Control proceeds to decision block 1220, which determines if the capacitance adjustment to provide an impedance match is complete. If the capacitance adjustment to provide an impedance match is not complete, control returns to block 1216, which updates the impedance match based on the admittance. If the match is complete, control proceeds to block 1222, which applies a frequency tuning to vary the frequency in order to vary the impedance match between the RF generator and the load. Control next proceeds to block 1224, which determines if the frequency adjustment match is complete. If the frequency adjustment to provide an impedance match is not complete, control returns to block 1216. If control is complete, control proceeds to end block 1226.

The advantages of the admittance-based impedance tuning over conventional approaches include reducing reflected power in each pulse state of pulses having multiple states by adjusting the capacitance to a new target based on virtual impedance. A further advantage in the admittance-based approach described herein is reduced reflected power through a combination of capacitive tuning and frequency tuning based on admittance, since the frequency tuning trajectory and admittance mixing trajectory are less than the respective trajectories of conventional approaches. Accordingly, impedance matching can be completed in less time than conventional approaches.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set—in other words, in some circumstances a "set" may have zero elements. The term "non-empty set" may be used to indicate exclusion of the empty set—in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" can be replaced with the term "controller" or the term "circuit." In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level 1 cache on or near a microprocessor die, which may store code from multiple modules. Another example of shared memory hardware may be persistent storage, such as a solid state drive (SSD), which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A controller for an impedance matching network for a RF power delivery system, comprising:
    a mixing module configured to receive a plurality of admittances generated in accordance with at least one parameter sensed from an output signal generated by a RF generator of the RF power delivery system, wherein the output signal is a pulsed RF signal having a plurality of states for each pulse and the plurality of admittances correspond to the plurality of states, and further configured to generate a virtual admittance determined in accordance with the plurality of admittances adjusted by a gain, respectively; and
    an impedance matching module configured to receive the virtual admittance and generate a command to adjust a capacitance of the impedance matching network or a command to adjust a frequency of the output signal in accordance with the virtual admittance.

2. The controller of claim 1 wherein the gain is determined in accordance with the at least one parameter sensed for each respective state of the plurality of states, and wherein the gain is weighted in accordance with a relative value of the at least one parameter sensed for each respective state of the plurality of states.

3. The controller of claim 1 wherein if there are two of the plurality of states, the gain for each of the two of the plurality of states adds to one.

4. The controller of claim 1 wherein the gain for each of the plurality of states adds to one.

5. The controller of claim 1 wherein the at least one parameter can be voltage, current, forward power, or reverse power.

6. The controller of claim 1 further comprising a motor control module configured to receive the command to adjust the capacitance of the impedance matching network and further configured to generate motor control commands to control a motor, wherein adjustment of the motor adjusts a variable capacitor of the impedance matching network.

7. The controller of claim 6 wherein the motor control module is further configured to generate a plurality of motor control commands to control a plurality of motors, wherein adjustment of the plurality of motors adjusts a plurality of variable capacitors of the impedance matching network.

8. The controller of claim 7 wherein one of the plurality of motors adjusts a variable capacitor of a series leg of the impedance matching network and a second of the plurality of motors adjust a variable capacitor of a shunt leg of the impedance matching network.

9. A RF power delivery system comprising:
    a RF power source configured to generate a pulsed RF output signal to a load; and
    an impedance matching network arranged between the RF power source and the load, the impedance matching network configured to receive the pulsed RF output signal and provide impedance matching between the RF power source and the load, the matching network including:
    a series leg having a first variable impedance;
    a shunt leg having a second variable impedance; and
    a controller, including:

a mixing module configured to receive a plurality of admittances generated in accordance with at least one parameter sensed from the RF output signal, wherein a pulse of the output signal has a plurality of states and the plurality of admittances correspond to the plurality of states, and further configured to generate a virtual admittance determined in accordance with the plurality of admittances adjusted by a gain, respectively; and an impedance matching module configured to receive the virtual admittance and generate a command to adjust a capacitance of the impedance matching network or a command to adjust a frequency of the RF signal in accordance with the virtual admittance.

10. The RF power delivery system of claim 9 wherein the impedance matching network further comprises a sensor configured to receive the pulse RF output signal and sense the at least parameter and output the plurality of admittances, wherein the plurality of admittances vary in accordance with the at least one parameter.

11. The RF power delivery system of claim 9 wherein the gain is determined in accordance with the at least one parameter sensed for each respective state of the plurality of states, and wherein the gain is weighted in accordance with a relative value of the at least one parameter sensed for each respective state of the plurality of states.

12. The RF power delivery system of claim 11 wherein if there are two of the plurality of states, the gain for each of the two of the plurality of states adds to one.

13. The RF power delivery system of claim 9 wherein the gain for each of the plurality of states adds to one.

14. The RF power delivery system of claim 9 wherein the at least one parameter can be voltage, current, forward power, or reverse power.

15. The RF power delivery system of claim 9 further comprising a motor control module configured to receive the command to adjust the capacitance of the impedance matching network and further configured to generate control commands to control at least one of the first variable impedance or the second variable impedance, wherein adjustment of the first variable impedance or the second variable impedance occurs by adjusting a first variable capacitor associated with the first variable impedance or a second variable capacitor associated with the second variable impedance.

16. The RF power delivery system of claim 15 wherein the control commands are motor control commands to a first motor controlling the variable capacitor associated with the first variable impedance and a second motor controlling the variable capacitor associated with the second variable impedance.

17. A non-transitory computer-readable medium storing instructions, the instructions comprising:

receiving a plurality of admittances generated in accordance with at least one parameter sensed from an output signal generated by a RF generator of the RF power delivery system, wherein the output signal is a pulsed RF signal having plurality of states for each pulse and the plurality of admittances correspond to the plurality of states, and generating a virtual admittance determined in accordance with the plurality of admittances adjusted by a gain, respectively; and in accordance with virtual admittance, generating a command to adjust a capacitance of the impedance matching network or a command to adjust a frequency of the output signal.

18. The non-transitory computer-readable medium storing instructions of claim 17, wherein the gain is determined in accordance with the at least one parameter sensed for each respective state of the plurality of states, and wherein the gain is weighted in accordance with a relative value of the at least one parameter sensed for each respective state of the plurality of states.

19. The non-transitory computer-readable medium storing instructions of claim 17 wherein if there are two of the plurality of states, the gain for each of the two of the plurality of states adds to one.

20. The non-transitory computer-readable medium storing instructions of claim 17 wherein the gain for each of the plurality of states adds to one.

21. The non-transitory computer-readable medium storing instructions of claim 17 wherein the at least one parameter can be voltage, current, forward power, or reverse power.

22. The non-transitory computer-readable medium storing instructions of claim 17 further comprising a motor control module configured to receive the command to adjust the capacitance of the impedance matching network and further configured to generate motor control commands to control a motor, wherein adjustment of the motor adjusts a variable capacitor of the impedance matching network.

23. The non-transitory computer-readable medium storing instructions of claim 22 wherein the motor control module is further configured to generate a plurality of motor control commands to control a plurality of motors, wherein adjustment of the plurality of motors adjusts a plurality of variable capacitors of the impedance matching network.

24. The non-transitory computer-readable medium storing instructions of claim 23 wherein one of the plurality of motors adjusts a variable capacitor of a series leg of the impedance matching network and a second of the plurality of motors adjust a variable capacitor of a shunt leg of the impedance matching network.

* * * * *